United States Patent
Hsieh et al.

[11] Patent Number: 6,054,350
[45] Date of Patent: Apr. 25, 2000

[54] EPROM CELL HAVING A GATE STRUCTURE WITH SIDEWALL SPACERS OF DIFFERENTIAL COMPOSITION

[75] Inventors: Tsong-Minn Hsieh; Kuo-Tung Sung, both of Hsinchu, Taiwan

[73] Assignee: Mosel Vitelic, Inc., Hsinchu, Taiwan

[21] Appl. No.: 09/054,358

[22] Filed: Apr. 2, 1998

[30] Foreign Application Priority Data

Dec. 12, 1997 [TW] Taiwan ................................. 86118811

[51] Int. Cl.⁷ ............................................. H01L 21/336
[52] U.S. Cl. ...................... 438/261; 438/257; 438/265
[58] Field of Search .................................. 438/261, 257, 438/265, 263, 264, 277, 283

[56] References Cited

U.S. PATENT DOCUMENTS

| | | | |
|---|---|---|---|
| 5,066,992 | 11/1991 | Wu et al. ................................. | 357/23.5 |
| 5,440,159 | 8/1995 | Larsen et al. ............................. | 257/318 |
| 5,479,368 | 12/1995 | Keshtbod ............................. | 365/185.01 |
| 5,484,741 | 1/1996 | Bergemont ................................ | 437/43 |
| 5,493,534 | 2/1996 | Mok .......................................... | 365/226 |
| 5,517,443 | 5/1996 | Liu et al. ................................... | 365/51 |
| 5,587,951 | 12/1996 | Jazayeri et al. ........................ | 365/203 |
| 5,589,412 | 12/1996 | Iranmanesh et al. ..................... | 437/43 |
| 5,606,532 | 2/1997 | Lambrache et al. ................. | 365/238.5 |
| 5,638,327 | 6/1997 | Dallabora et al. .................. | 365/185.33 |
| 5,640,031 | 6/1997 | Keshtbod ................................ | 257/315 |
| 5,661,052 | 8/1997 | Inoue et al. ............................. | 438/303 |
| 5,665,623 | 9/1997 | Liang et al. ............................. | 438/239 |
| 5,680,346 | 10/1997 | Pathak et al. ........................ | 365/185.1 |
| 5,712,180 | 1/1998 | Guterman et al. ....................... | 437/43 |

*Primary Examiner*—John F. Niebling
*Assistant Examiner*—Neal Berezny
*Attorney, Agent, or Firm*—Townsend and Townsend and Crew LLP

[57] ABSTRACT

A split gate EPROM cell and a method that includes a gate structure having a sidewall spacer of differential composition disposed about a floating gate which facilitates control of the spacer thickness during fabrication. Controlling the thickness of the spacer allows avoiding a reduction of the distance between the floating gate and the control gate as well as leakage of the charge from the floating gate.

11 Claims, 7 Drawing Sheets

EPROM CELL HAVING A GATE STRUCTURE WITH SIDEWALL SPACERS OF DIFFERENTIAL COMPOSITION

BACKGROUND OF THE INVENTION

The present invention relates to the field of semiconductor electronic devices and a method for manufacturing the same. More particularly, the present invention relates to a process ideally suited for manufacturing erasable programmable read-only memory cells.

Erasable programmable read-only memory (EPROM) technology is known for use in both memory and programmable logic applications. In particular, EPROMs are implemented using floating gate field effect transistors in which the binary states of the EPROM cell are represented by the presence or absence of sufficient charge on the floating gate to prevent conduction even when a normal high signal is applied to the gate of the EPROM transistor.

In the traditional and most basic form, EPROMs are programmed electrically and erased by exposure to ultraviolet light, and are typically referred to as ultraviolet erasable programmable read-only memories (UVEPROMs). As seen in FIG. 1, a UVEPROM cell typically includes a storage transistor 10 having two polysilicon gates disposed above a P-doped substrate 12 with a pair of spaced-apart N-doped active regions 14 and 16 defining a channel region 18 therebetween. The two polysilicon gates are disposed above the channel region 18 with the opposing ends of each of the polysilicon gates overlapping one of the active regions 14 and 16. One gate is disposed between the remaining gate and the substrate 12, defining a floating gate 20. The remaining gate is spaced apart from the floating gate 20 and defines a control gate 22. The floating gate 20 is embedded in an oxide 24 which facilitates capacitive coupling to both the control gate 22 and the substrate 12. A UVEPROM cell is programmed by running a high current between the active regions 14 and 16 while applying a positive potential to the control gate 22. This is typically achieved by grounding one of the active regions, such as the source 14, while applying the positive potential to both the control gate 22 and the remaining active region, the drain 16. In this fashion, electrons in the substrate 12 obtain sufficient energy to overcome the 3.2 eV energy barrier at the interface between the silicon substrate and the silicon dioxide. This phenomenon is typically called electron injection. The positive voltage on the floating gate 20 causes the electrons to collect thereon. The cell 10 is erased by internal photo emission of electrons from the floating gate 20 to the control gate 22 and the substrate 12. Ultraviolet light increases the energy of the floating gate electron to a level where they jump the 3.2 eV energy barrier and return to the substrate 12.

Another form of EPROM is the electrically erasable programmable read-only memory (EEPROM or $E^2$PROM), commonly referred to as flash EPROMs. Storage transistors for flash EPROMs generally include two serially connected N-channel metal oxide semiconductor transistors in which one of the transistors has an additional gate that is floating and is sandwiched between a control gate and a channel. This floating gate is used to store positive or negative charges which determine the state of the flash EPROM. The other transistor is used for selection purposes. The electrons transfer between the floating gate and the drain by Fowler-Nordheim tunneling. This is a quantum mechanical phenomenon that allows electron to pass through the aforementioned silicon substrate-silicon dioxide interface at an energy below 3.2 eV. Programming of the cell is achieved by tunneling from the floating gate to the drain, leaving the floating gate relatively more positively charged. In the erase mode, the control gate is at a high voltage and the drain is grounded. A drawback with Fowler-Nordheim tunneling is that it often results in over-erase of the flash EPROM cell which tends to leave the floating gate positively charged.

To overcome the over-erase problem associated with Fowler-Nordheim tunneling, a flash EPROM cell employing a split gate storage transistor 26, shown in FIG. 2 was developed. The split gate transistor 26 merges the control gate 28 with the floating gate 30 over the channel 32. The split gate transistor 26 is characterized by the control gate 28 having a first conductive region 34 which extends parallel to both the channel 32 and the floating gate 30 and a second region 36 which extends from the first conductive region 34, transversely thereto toward the channel 32. The second conductive region 36 prevents the cell from "turning-on" as a result of positive charge on the floating gate 30. As before, the floating gate is embedded in an oxide layer 38 so as to be capacitively coupled to both the control gate 28 and the channel region 32.

A problem encountered with the manufacture of flash EPROMs concerned variations in the dimensions of the oxide layer. Specifically, areas of the oxide layer are formed so that they are relatively thin resulting in sharp needle-like protrusions that extend from the surface of the polysilicon gate into the thermal oxide. This results from oxidation progressing faster along certain crystal directions, e.g., at the intersection of two surfaces extending transversely to one another. Electric fields concentrate at the tips of these protrusions which support enhanced localized conduction as much as an order of magnitude greater than in protrusion-free silicon surfaces.

Recent trends in flash EPROM design have employed thermal techniques to control the size and shape of these protrusions. In this fashion, silicon oxide layers having a greater over-all thickness may be employed while still providing Fowler-Nordheim tunneling. However, controlling the size and shape of these protrusions is particularly problematic with the split gate cell design as it may cause shorting between the gates in a worse case and can make charge retention in the floating gate problematic which causes premature erasing of the cell in the most harmless case.

What is needed, therefore, is a flash EPROM cell and method for manufacturing the same, which allows precise control of the thickness of dielectric oxide layers positioned between the control and floating gates.

SUMMARY OF THE INVENTION

The present invention provides a split gate transistor for an EPROM cell and a method for forming the same that includes forming a gate structure having a sidewall spacer of differential composition disposed about a floating gate which facilitates control of the spacer thickness during fabrication. An exemplary embodiment of the EPROM cell is formed atop a silicon substrate and includes a first oxide region disposed on the substrate, and a first region of conductive material disposed adjacent to the first oxide region that extends coextensive therewith. The first oxide region is typically formed from silicon dioxide and the first conductive region is formed from polysilicon. The first conductive layer has a surface disposed adjacent to the first oxide region and two spaced-apart edges extending transversely to the surface. A plurality of side-wall spacers are provided, each of which is in abutting relationship with one of the minor surfaces. A first portion of each of the plurality of side-wall spacers is formed from a single layer of material, defining a single-wall portion. A second portion of each of the plurality of side-wall spacers includes two layers of differing materials, defining a double-wall portion. An oxide-nitride-oxide composite is typically employed to form the single wall portion as well as one of the layers of the double-wall portion. The remaining layer of the double wall portion is formed from silicon nitride. Disposed adjacent to the plurality of sidewall spacers, as well as the major surface, is an additional oxide region. A second conductive region is disposed adjacent to, but spaced apart from, the first conductive region. The first conductive region is disposed between the substrate and a first segment of the second conductive region, with a second segment of the second conductive region extending from the first segment, transversely thereto toward the substrate. In this fashion, the first conductive region forms the floating gate and the second conductive region forms the control gate of the split gate storage transistor.

The split gate transistor is constructed by forming, on a substrate, the first oxide region and then forming, on the oxide region, a first region of conductive material having a major surface and two spaced-apart minor surfaces extending transversely to the major surface. A second oxide region is formed in abutting relation with the major surface and the spaced-apart minor surfaces. The second oxide region is covered with a nitride region. Thereafter, a portion of the second oxide region and a segment of the nitride region, both of which are positioned proximate to the major surface, are removed so as to expose the first major surface. The segment of the nitride region removed also includes areas of the nitride region disposed adjacent to the minor surfaces. In this manner, spacers are formed in abutting relation with the minor surfaces so as to have a single wall portion and a double wall portion. Subsequent to the formation of the spacers, an additional oxide region is formed adjacent to the major surface followed by the formation of a conductive region adjacent to, but spaced apart from, the region of first conductive material. Providing spacers having differential composition facilitates control of the dielectric surrounding the floating gate and, therefore, the distance between the floating gate and the control gate and reducing leakage of the charge from the floating gate, thereby improving the charge retention properties of the storage transistor.

DETAILED DESCRIPTION OF THE SPECIFIC EMBODIMENTS

Figure 1:
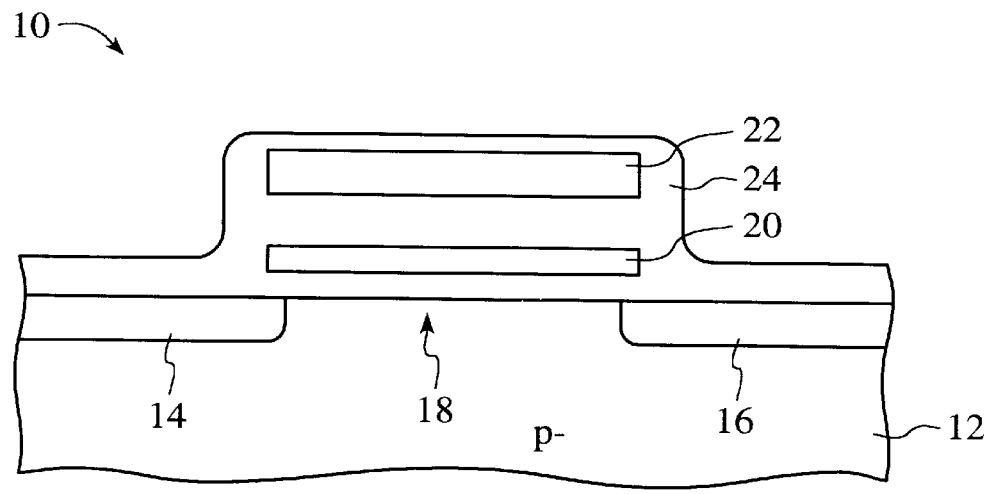
FIG. 1 is a cross-sectional view of a stacked gate storage transistor employed in an EPROM cell of the prior art.
Figure 2:
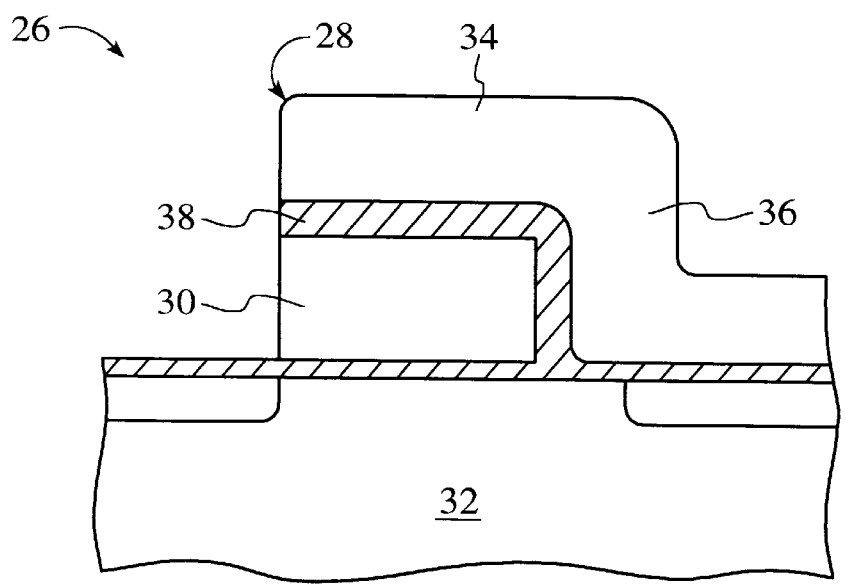
FIG. 2 is a cross-sectional view of a split gate storage transistor employed in an EPROM cell of the prior art.
Figure 3:
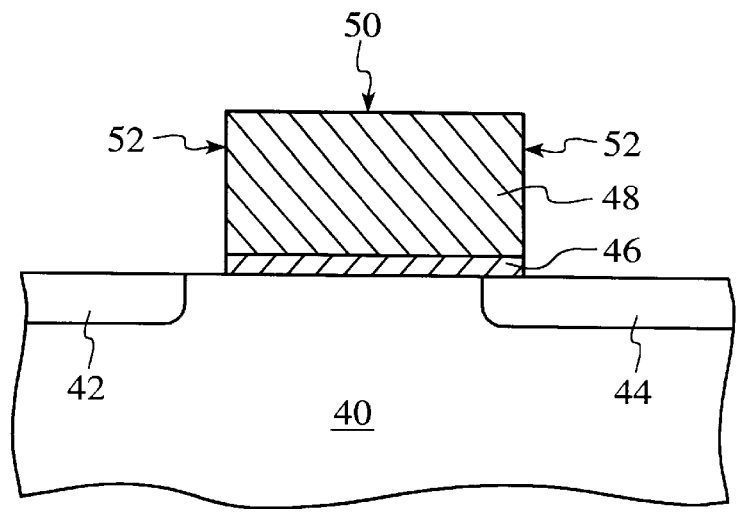
FIG. 3 is a cross-sectional view showing the fabrication of a floating gate of a storage transistor for an EPROM cell in accord with the present invention.

Referring to FIG. 3, an exemplary split gate EPROM cell employing the present invention may be formed on a silicon substrate 40 that is composed of P⁻ doped single crystalline silicon. A relatively thick Field OXide (FOX) (not shown) is formed on and in portions of the substrate surface surrounding and electrically isolating active device areas 42 and 44 using LOCal Oxidation of Silicon (LOCOS) method commonly practiced in the semiconductor industry. The LOCOS process includes depositing, or thermally growing, a thin pad oxide (not shown) composed of silicon oxide on the substrate surface and then depositing a silicon nitride ($Si_3N_4$) layer (not shown), usually by chemical vapor deposition (CVD), with the nitride layer serving as a barrier to thermal oxidation. The silicon nitride layer is patterned leaving portions over the silicon substrate where active device regions are required semiconductor devices, such as field effect transistors. The silicon substrate is then subjected to an oxidizing ambient, such as steam oxidation, to form the aforementioned relatively thick field oxide regions composed of silicon dioxide ($SiO_2$) surrounding the active device areas 42 and 44.

After removing the silicon nitride layer, for example in a hot phosphoric acid solution, and the pad oxide in a dilute solution of hydrofluoric acid, a tunnel oxide 46 is formed, typically from silicon dioxide by thermal oxidation so as to overlap a portion of each of the active device areas 42 and 44. A stacked gate structure is formed atop of the tunnel oxide 46 having a floating gate and a control gate. The floating gate is constructed from a region of polysilicon 48 formed over the tunnel oxide 46. The first region of polysilicon 48 includes a major surface 50, disposed opposite to the gate oxide 46 and two spaced apart edges 52 which extend transversely to the surface 50.

Figure 4:
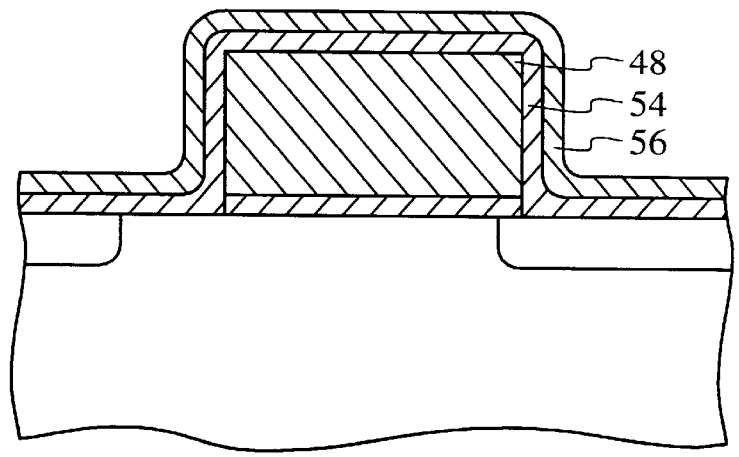
FIG. 4 is a cross-sectional view of the storage transistor shown in FIG. 3 demonstrating the deposition of dielectric layers atop of the floating gate.
Figure 5:
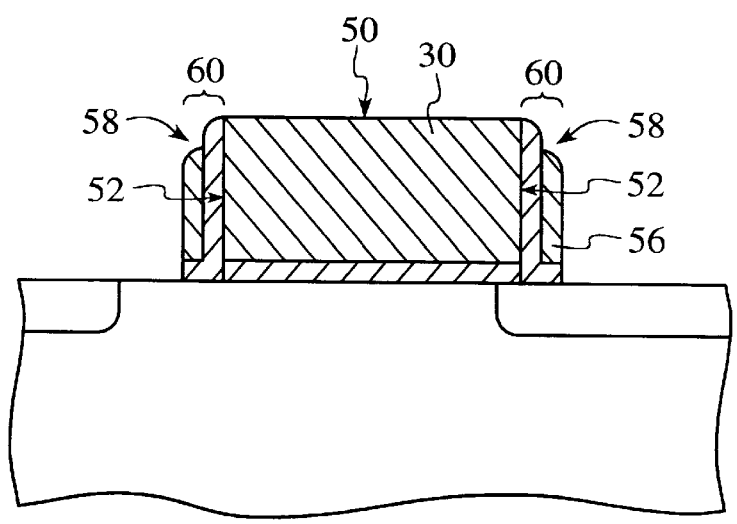
FIG. 5 is a cross-sectional view of the storage transistor, shown in FIG. 4, with spacers having differential composition formed by selectively etching the dielectric layers.

Referring to FIG. 4 a layer of oxide 54 is formed over the region of polysilicon 48. The oxide layer 54 is typically deposited by chemical vapor deposition (CVD) techniques. Thereafter, a nitride layer 56, typically comprising silicon nitride, is formed atop of the layer of oxide 54. A portion of the oxide layer 54 and a segment of the nitride layer 56 are then both removed so as to expose the surface 50, shown more clearly in FIG. 5, which is typically achieved by anisotropically etching the same. The segment of the nitride layer 56 removed also includes areas of the nitride layer 56 disposed adjacent to, but spaced-apart from, the minor surfaces 52, shown as 58. In this manner, a plurality of spacers 60 are formed having differential composition is formed with each of the edges 52 being in abutting relation with one of the plurality of spacers 60.

Figure 6:
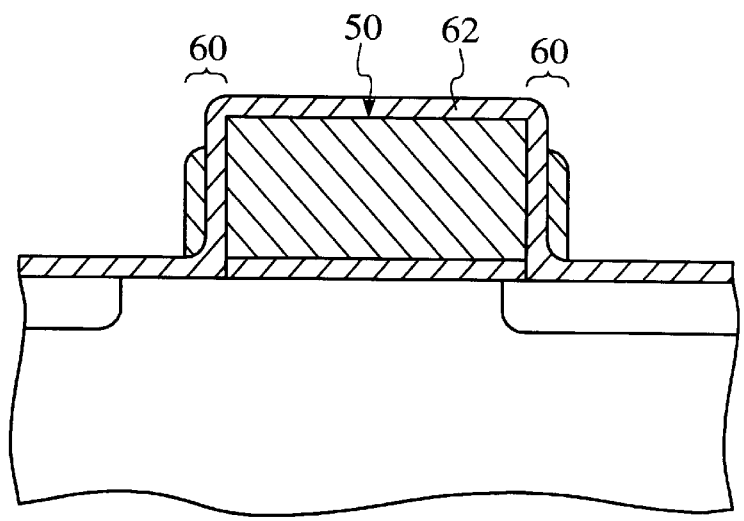
FIG. 6 is a cross-sectional view showing the formation of an additional dielectric layer atop of the floating gate of the storage transistor shown above in FIG. 5.
Figure 7:
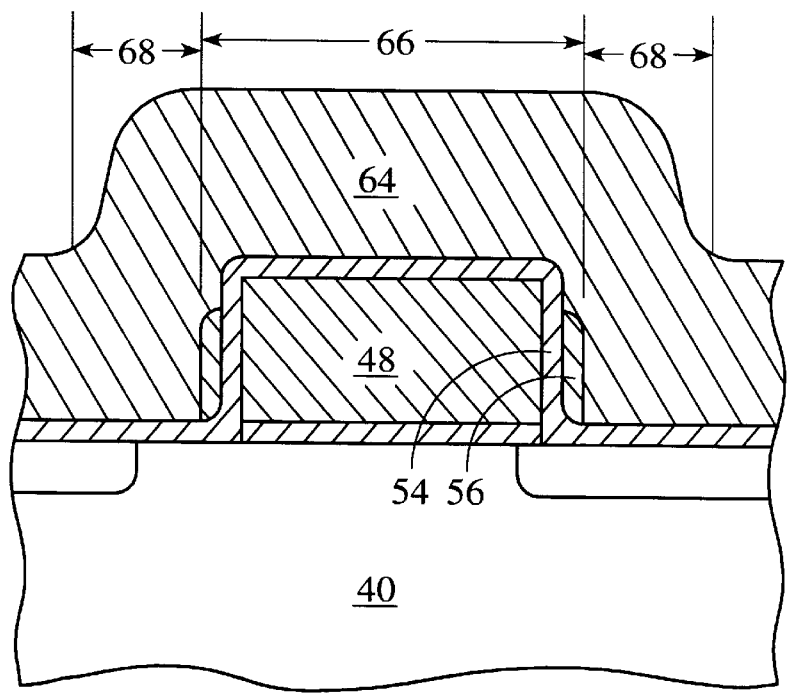
FIG. 7 is a cross-sectional view showing formation of a control gate atop of the additional dielectric layer of the storage transistor shown above in FIG. 6.

Referring to FIG. 6, formed adjacent to the surface 50 is thermal oxide layer 62. The control gate is formed from a second polysilicon region 64 disposed adjacent to, but spaced apart from, the first region of polysilicon 48, shown more clearly in FIG. 7. Specifically, the second region of polysilicon 64 includes a first segment 66, with the first region of polysilicon 48 being disposed between the first segment 66 and the substrate 40. A second segment 68 of the second region of polysilicon 64 extends from the first segment 68, transversely thereto, toward the substrate 40. Additional layers (not shown) may be deposited atop of the second region of polysilicon 42 to form a contact.

Figure 8:
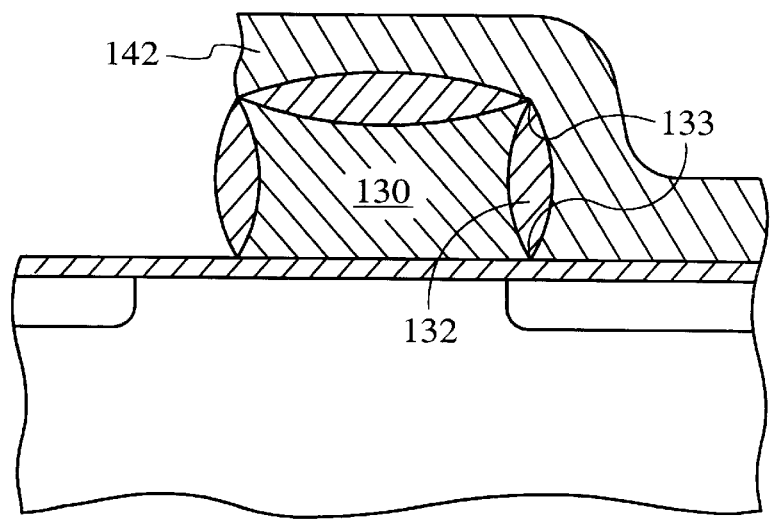
FIG. 8 is a partial cross sectional view showing a split gate storage transistor employed in of the prior art.

An advantage of providing spacers 60 having a differential composition is that it allows precise control of the dimensions of the spacers 60 during fabrication. Specifically, when forming an oxide layer, such as oxide layer 54, about a polysilicon region, such as a first region of polysilicon 48, the thickness of the layer 54 varies depending upon the shape of the surface upon which it is being formed and the materials positioned proximate thereto. For example, as shown in FIG. 8, an oxide layer 132 is positioned between two spaced-apart polysilicon layers 130 and 142. As seen, a region 133 of the oxide layer 132 positioned adjacent to both the polysilicon layer 130 and a silicon substrate 123 is substantially thinner than the remaining regions of the oxide layer 132. The differing thickness of the oxide layer 132 and region 133 results from the different oxidation rate of the conduction layer 130 as compared to the oxidation rate of the substrate 123, as well as the inherent low oxidating rate at the corner of the conductive layer 130. The presence of the thin region 133 can prove problematic to the operation of the EPROM cell. Charges present in the conductive layer 130 can leak through region 133 and significantly degrade the charge retention of the cell.

Referring again to FIG. 7, providing the differential composition spacers 60 facilitates control of the dielectric disposed between the first and second regions of polysilicon 48 and 64. This is due to the relatively dense nature of a nitride, such as silicon nitride, which prevents further oxidation of the oxide layer 54 during thermal fabrication processes which occur subsequent to the formation of the oxide layer 54. This, in turn, reduces leakage of the charge from the floating gate, thereby improving the charge retention properties of the cell. Specifically, the thickness of the spacers 60 positioned proximate to the substrate 40 is defined by the combined thickness of the nitride layer 56 and the oxide layer 54 layer. By varying the thickness of the nitride layer 56, the thickness uniformity of the overall spacer 60 may be controlled so that it is substantially uniform along the length of the same. Typically, the thickness of the nitride layer 56 is 50–300 Å and the thickness of the oxide layer 54 is 50–300 Å.

Figure 9:
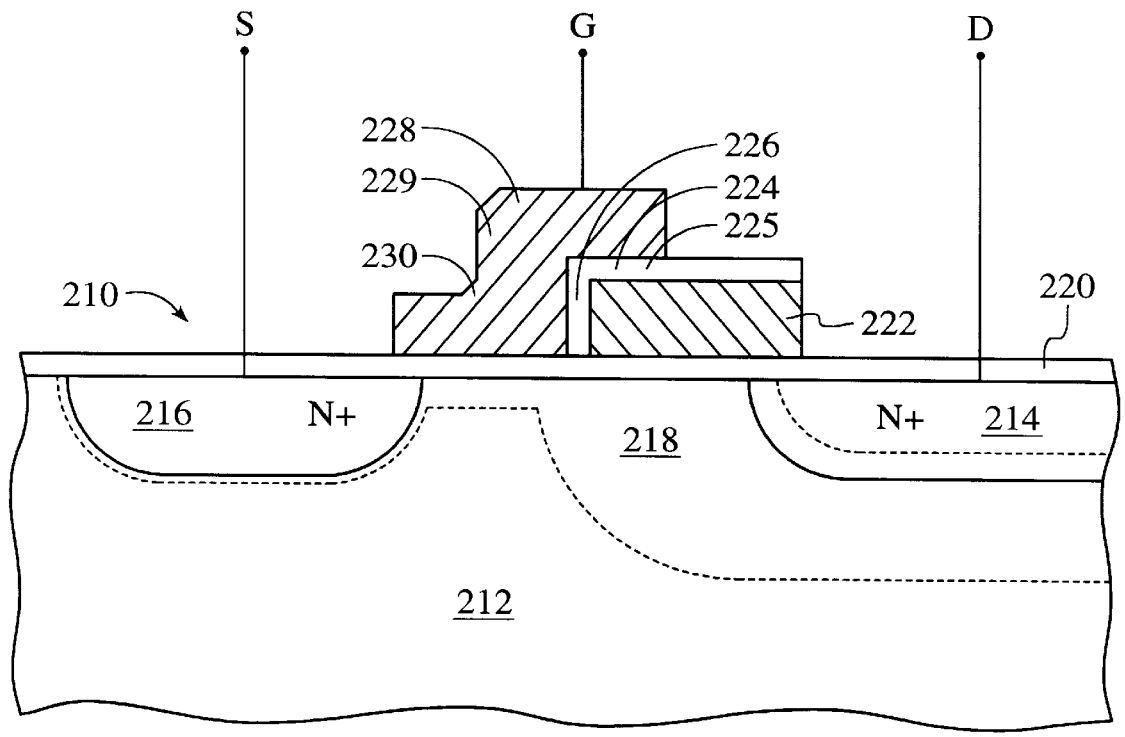
FIG. 9 is a cross-sectional view of a split gate storage transistor formed according to the method discussed above with respect to FIGS. 3–7.

FIG. 9 shows a single transistor non-volatile electrically alterable semiconductor memory storage transistor 210 according to a specific embodiment of the present invention. The storage transistor 210 comprises a semiconductor substrate 212, such as silicon. The substrate 212, in one embodiment, can be a P-type silicon substrate with a typical doping level range from 5 to 50 ohm-cm, depending on the level of scaling. Within the substrate 212 are defined a source region 216 and a drain region 214 with a channel region 218 therebetween. Disposed over the source region 216, channel region 218, and drain region 214 is a first layer 220 of insulating material, on the order of, e.g., 70–200 angstrom of thickness.

Disposed over the first layer 220 is a floating gate 222. The floating gate 222 is positioned over a portion of the channel region 218 and over a portion of the drain region 214. The floating gate 222 can be a polysilicon gate and in one embodiment is a re-crystallized polysilicon gate. A second insulating layer 225, ormed in accordance with the method discussed above with respect to FIGS. 3–7, has a first portion 224 disposed over the floating gate 222 and a second portion 226 disposed adjacent to the floating gate 222. The first portion 224 (top wall 224) of the second layer 225 is 1000–3000 Å thick and second portion 226 (side wall 226) is 150–1200 Å thick. A control gate 229 has two portions: A first portion 228 is disposed over the top wall 224 of the second layer 225; a second portion 230 is disposed over the first layer 220 and is immediately adjacent to the side wall 226 of the second layer 225. The second portion 230 of the control gate 229 extends over a portion of the source region 216 and over a portion of the channel region 218.

The dimensions of the storage transistor 210 depend upon the process used. Thus, the foregoing dimensions for the first layer 220, side wall 226, and top wall 224 are only illustrative examples. Further, the material, for the first layer 220 and the second layer 225 are also illustrative examples only. In general, however, the dimensions of the storage transistor 210 are such that electrons emanating from the source region 216 are injected onto the floating gate 222 by sensing an abrupt potential drop. Further, the dimensions of storage transistor 210 are such that charges from the floating gate 222 are removed by tunneling through the Fowler-Nordheim mechanism through, for example, the second layer 225 onto the control gate 229. The particular manner of operating the storage transistor 210 is as follows:

Initially, when it is desired to erase storage transistor 210, a ground potential is applied to the drain 214 and to the source 216. A high-positive voltage, on the order of, e.g., +15 volts, is applied to the control gate 229. Charges on the floating gate 222 are induced through the Fowler-Nordheim tunneling mechanism to tunnel through the second layer 225 to the control gate 229, leaving the floating gate 222 positively charged.

When selective cells 210 are desired to be programmed, a ground potential is applied to the source region 216. A positive voltage level in the vicinity of the threshold voltage of the MOS structure defined by the control gate 229, (on the order of approximately +1 volt, for example), is applied to the control gate 229. A positive high voltage, on the order of, e.g., +12 volts, is applied to the drain region 214. Electrons generated by the source region 216 will flow from the source region 216 towards the drain region 214 through a weakly-inverted channel region 218. When the electrons reach the region where the control gate 229 meets the side wall 226, the electrons see a steep potential difference approximately equal to the drain voltage, across the surface region defined by the gap of the side wall 226. The electrons will accelerate and become heated and some of them will be injected into and through the first insulating layer 220 onto the floating gate 222.

The injection of electrons onto the floating gate 222 will continue until the charged floating gate 222 can no longer sustain a high surface potential beneath, to generate hot electrons. At that point, the electrons or the negative charges in the floating gate 222 will "turn off" the electrons from flowing from the source region 216 onto the floating gate 222.

Finally, in a read cycle, ground potential is applied to the source region 216. Conventional transistor read voltage, such as +2 volts and +5 volts, are applied to the drain region 214 and to the control gate 229, respectively. If the floating gate 222 is positively charged (i.e., the floating gate is discharged), then the channel region 218 directly beneath the floating gate 222 is turned on. When the control gate 229 is raised to the read potential, the region of the channel region 218 directly beneath the second portion 230 is also turned on. Thus, the entire channel region will be turned on, causing electrical current to flow from the drain region 214 to the source region 216. This would be the "1" state.

On the other hand, if the floating gate 222 is negatively charged, the channel region 218 directly beneath the floating gate 222 is either weakly turned on or is entirely shut off. Even when the control gate 229 and the drain region 214 are raised to the read potential, little or no current will flow through the portion of the channel region directly beneath the floating gate 222. In this case, either the current is very small compared to that of the "1" state or there is no current at all. In this manner, the storage transistor 210 is sensed to be programmed at the "0" state.

Figure 10:
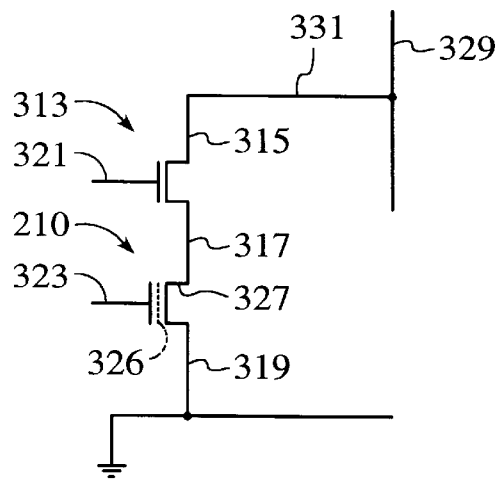
FIG. 10 is a schematic diagram of a memory cell employing the transistor shown above in FIG. 9.

Referring to FIG. 10, a schematic circuit diagram of a memory cell according to another specific embodiment of the present invention is shown including the storage transistor 210 and a field effect transistor 313 to allow selection of memory device 311 from among other memory cells. A drain 315 of selection transistor 313 is connected via a metal contact 331 to a read line 329. Selection transistor 313 and storage transistor 210 are connected together in series at a node 317 which serves as both a source for selection transistor 313 and a drain for storage transistor 210. A source 319 of storage transistor 210 connects to a common source line which in turn is coupled to ground. The gate 321 of selection transistor 313 is electrically connected to a word select line. The control gate 323 of storage transistor 210 is connected to a sense enable and program line. The circuit of FIG. 10 also includes in the storage transistor 210 a floating gate 326 (as represented in FIG. 10 by a dashed line), separated from the substrate by only a thin oxide layer. A program and erase implant 327 is provided in storage transistor 210 proximate to the device 317. The thin oxide layer together with the program and erase implant 327 permit rapid erasure of storage transistor 210 electrically in a few milliseconds, instead of the usual twenty minutes or so with UV light with the thicker oxide layer under the floating gate of prior memory devices. The implant 327 also enables more efficient reprogramming to occur.

Figure 11:
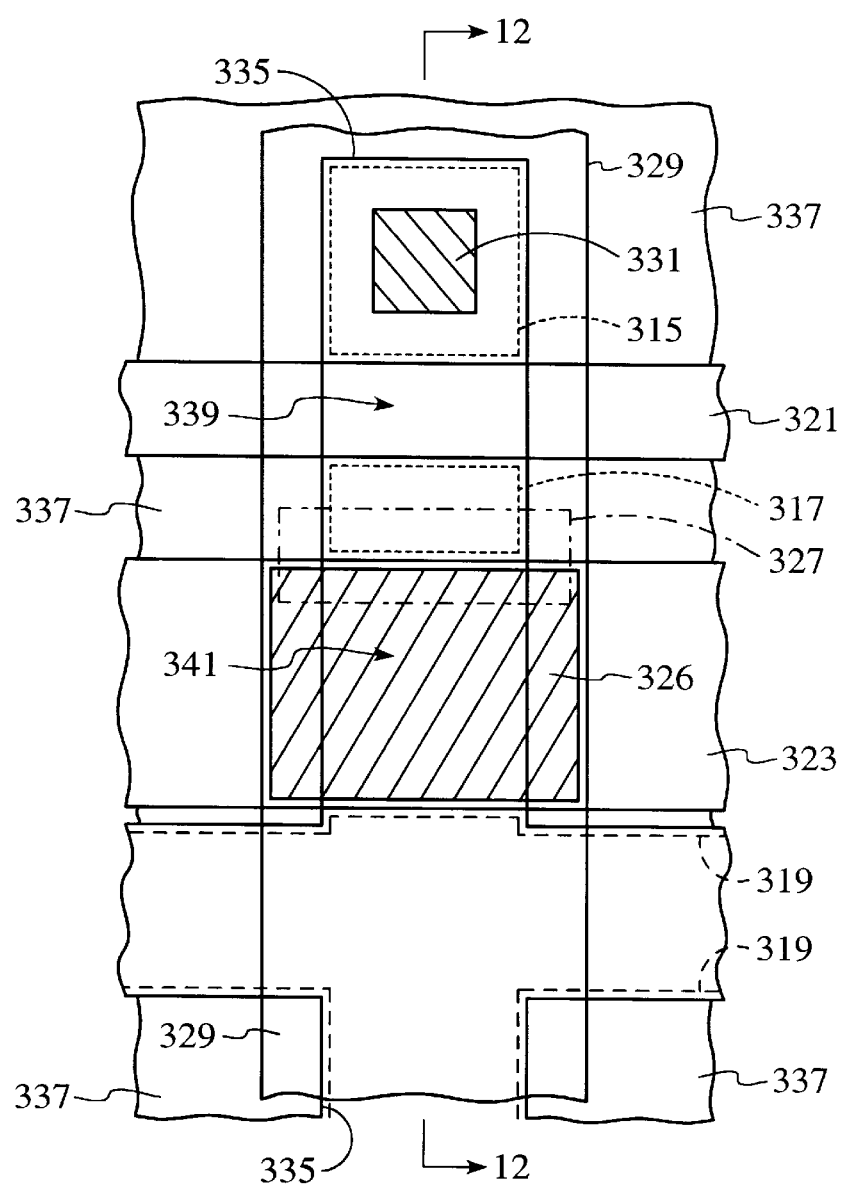
FIG. 11 is a top plan view of the memory cell shown in FIG. 10.
Figure 12:
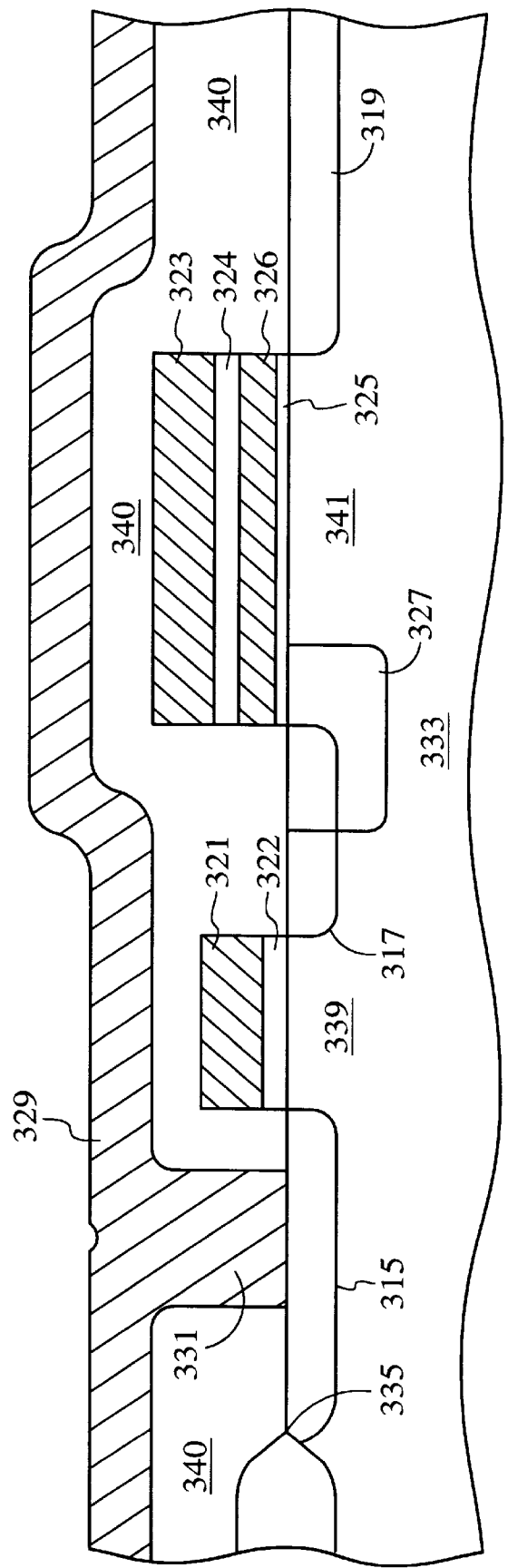
FIG. 12 is a side sectional view of the memory cell shown in FIG. 11, taken along the line 12—12.

FIG. 11 is a top plan view of the memory cell of FIG. 10. FIG. 12 is a side sectional view taken along the line 12—12 in FIG. 11. With reference to FIGS. 11 and 12, a semiconductor chip having an array of memory cells comprises a semiconductor substrate 333 with active memory areas 335 therein. A field isolation oxide layer 337 is present over all nonactive areas outside of memory areas 335. Three spaced-apart implants 315, 317 and 319 are located in memory area 335 with channel areas 339 and 341 defined therebetween. Implant 315 forms a drain for the selection transistor 313 in the circuit of FIG. 7. Implant 317 forms a node functioning as both a source for selection transistor 313 and a drain for storage transistor 210 in FIG. 10. Implant 319 forms a source for storage transistor 210. Typically, substrate 333 is P-type and implants 315, 317 and 319 are N-type.

A program and erase implant 327 is also present in the active memory area 335 of substrate 333. Implant 327 overlaps part of node implant 317, extending into channel 341 between implants 317 and 319 of the storage transistor 210. Implant 327 is typically N-type and may be formed by either phosphorus or arsenic ion implantation followed by diffusion, as explained below. A thin oxide layer 325 is disposed over channel 341 between implants 317 and 319, including over the portion of program and erase implant 327 which extends into channel 341, in active area 335. Typically, thin oxide layer 325 is between 70 Angstrom and 150 Angstrom thick. The remainder of active area 335 between field oxide layer 337 has an oxide layer 322 over it. Oxide layer 322 is thicker than thin oxide layer 325, typically about 300–500 Angstrom thick.

A polysilicon floating gate 326 is disposed on thin oxide layer 325 and extends over that portion of program and erase implant 327 that is beneath thin oxide layer 325. An inter-poly oxide layer 324 is disposed on floating gate 326 and a polysilicon sense gate 323 is situated above interpoly oxide layer 324. A polysilicon select gate 321 is disposed above oxide layer 322 which overlies channel 339 between implants 315 and 317. The entire wafer is covered with an insulating glass layer 339 with vias for contacts 331 therein. A layer of conductive lines 329 is disposed on top of glass layer 340.

Figure 13:
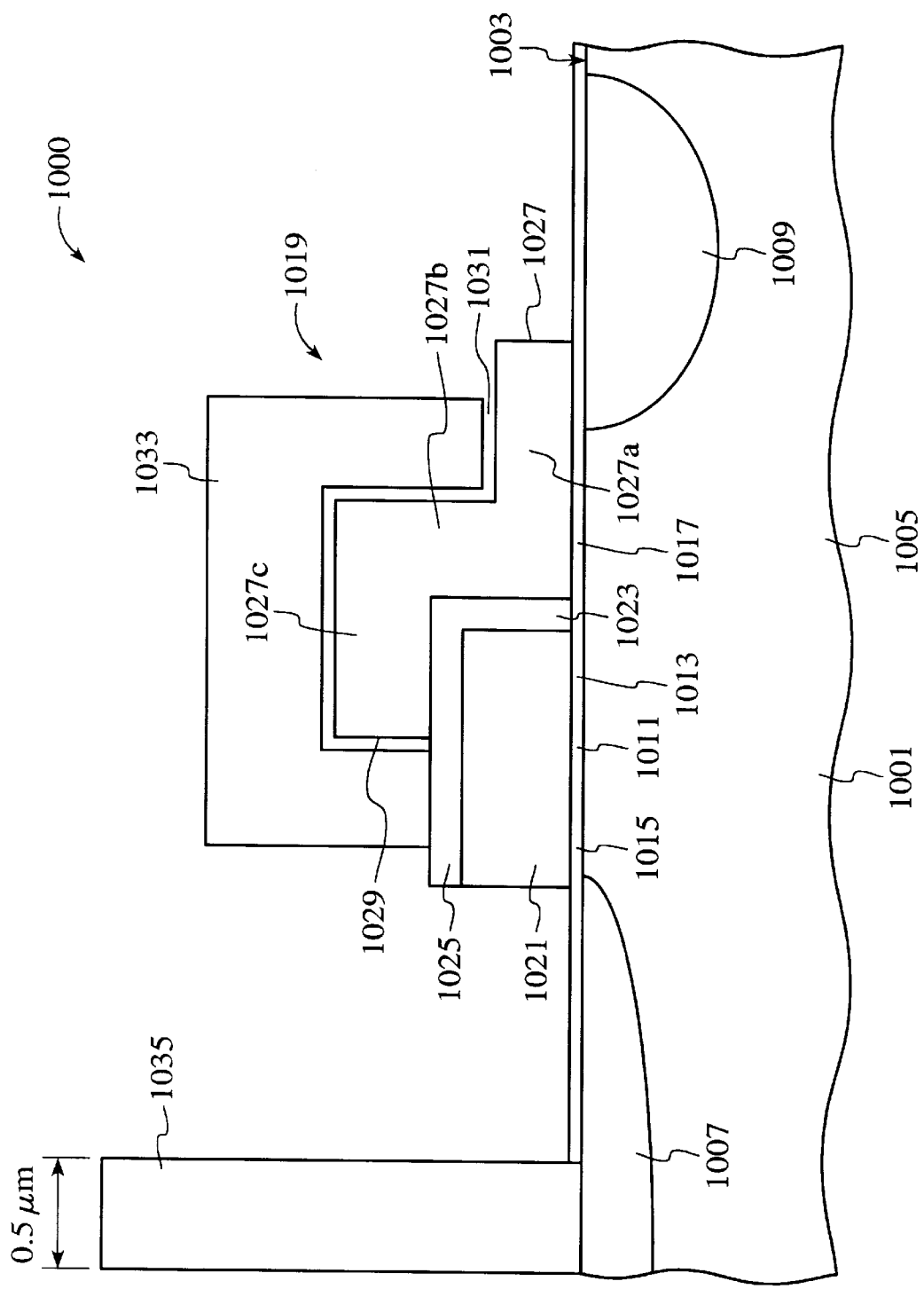
FIG. 13 is a flash memory cell employing a storage transistor formed according to the method discussed above with respect to FIGS. 3–7.

In a specific embodiment, the present invention can be applied to an improved flash memory cell 1000, such as the one shown in the simplified diagram of the FIG. 13. This diagram is merely an illustration and should not limit the scope of the claims. One of ordinary skill in the art would recognize other variations, alternatives, and modifications. Memory cell 1000 is defined in substrate 1001, which includes an upper surface 1003 that is substantially planar in geometry. A well region 1005 is defined in the substrate. The well region 1005 has a drain region 1007 and a source region 1009. In some embodiments, the drain region is a common drain region, which is shared by another memory cell. Similarly, the source region can be a common source region, which is shared by another memory cell. Between the source region and the drain region is a channel region 1011. The source and drain regions are made using implantation techniques, but can also be made using plasma immersion ion implantation or the like. A dielectric layer 1013, including a gate dielectric layer 1015 and a tunnel dielectric layer 1017, is defined overlying the channel region 1011. These dielectric layers can be made using a suitable material including silicon dioxide, silicon nitride, silicon oxynitride, and others. In the context of this embodiment, the gate dielectric and tunnel dielectric layers are made of high quality silicon dioxide. The tunnel dielectric layer is substantially uniform and substantially pinhole free. Additionally, the tunnel dielectric layer can withstand numerous programming and erase cycles.

The memory cell 1000 also includes a novel gate structure 1019. In particular, the gate structure 1019 includes a select gate 1021, which is defined from a first polysilicon layer, e.g., poly-1. The select gate is made from a polysilicon layer that is doped using N-type impurities. In some embodiments, the impurities are diffused using a POCl$_3$ compound or the like. Alternatively, the split gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer. The select gate overlies gate oxide and extends to the drain region. A sidewall spacer 1023 and an overlying insulating layer 1025 are defined overlying the select gate. The sidewall spacer and the insulating layer insulate and isolate the select gate from overlying circuit elements, e.g, control gate, floating gate. The select gate also has a channel region ranging from about 0.2 microns and less or about 1.0 microns and less, but is not limited to these ranges. Additionally, the select gate has a thickness of about 500 Angstroms and less and about 3500 Angstroms and less, but is not limited to these ranges.

The gate structure 1019 also includes a split floating gate 1027 overlying a portion of the upper surface of the substantially planar substrate, and also overlaps a portion of the select gate, which is defined overlying the planar surface of the substrate. That is, the split floating gate is defined overlying insulating layer 1025, which forms overlying the top surface of the select gate. The split gate also overlies an edge(s) including sidewall spacer 1023 of the select gate.

The split gate 1027 also has an edge 1029 overlying a region on the top surface of the select gate 1021. Split floating gate 1027 also extends from the select gate to a region overlying tunnel dielectric layer 1017 and extends to source region 1009. Accordingly, the split gate has at least three regions, including a lower horizontal region 1027A overlying the planar surface (which includes the tunnel oxide and the source/drain region), a vertical region 1027B overlying an edge or sidewall spacer of the select gate, and an upper horizontal region 1027C overlying the top surface of the select gate. The lower horizontal region 1027A, the vertical region 1027B, and the upper horizontal region 1027C define the split gate structure.

The split gate 1027 can be made of any suitable material such as, for example, polysilicon, e.g., poly-2. In most embodiments, the split gate is made from a polysilicon layer that is doped using N-type impurities. In some embodiments, the impurities are diffused using a $POCl_3$ compound or the like. Alternatively, the floating gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A dielectric layer(s) 1031 is defined overlying the floating gate. The dielectric layer forms along edges of the floating gate, which are over the select gate. Additionally, the dielectric layer overlies the top surface of the upper horizontal region, overlies an outer surface of the vertical region, and extends over the lower horizontal region of the floating gate structure. The dielectric layer insulates and isolates the floating gate from a control gate 1033. Of course, the type of dielectric layer used depends highly upon the size and shape of the floating gate and control gate. The dielectric layer 1031 can be any suitable layer or combinations of layers such as an oxide-on-nitride-on-oxide, which is commonly termed "ONO." It is preferred, however, that the dielectric layer be formed employing the method discussed above with respect to FIGS. 3–7. In this fashion, the dielectric layer is provided with a differential composition.

Control gate 1033 forms overlying the dielectric layer 1031, which is sandwiched between the floating gate and the control gate. The control gate is defined overlying edge 1029 of the floating gate, which is over a top portion of the select gate. The control gate also forms overlying the upper horizontal region, the vertical region, and the lower horizontal region of the floating gate. The control gate can be made of any suitable material such as, for example, polysilicon, e.g., poly-3. In most embodiments, the control gate is made from a polysilicon layer that is doped using N-type impurities. In some embodiments, the impurities are diffused using a $POCl_3$ compound or the like. Alternatively, the control gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A contact 1035 is defined overlying the drain region. Contacts are also defined on the select gate, the control gate, and the source region. These contacts can be made using a variety of techniques. For example, the contacts can be made using a combination of metals such as aluminum with a barrier metal such as titanium nitride, titanium tungsten, and others. Alternatively, the contacts can be made using a tungsten layer or copper layer with a barrier metal. Furthermore, the contacts can be made from "plugs" such as tungsten plugs, polysilicon plugs, aluminum plugs, and the like. The plugs can be used with or without a barrier layer, or can also be grown in a selective manner. Of course, the type of contacts used depends highly upon the application.

In the present embodiment, the gate coupling ratio or GCR is increased by way of the present novel transistor design. GCR increases by increasing the area of the floating gate that is capacitively coupled to the control gate relative to the area of the floating gate that is capacitively coupled to the tunnel oxide overlying the active cell region. As shown, the control gate couples to the floating gate through exposed surfaces of edge 1029, upper horizontal region 1027C, and vertical region 1027B. Floating gate couples to the tunnel oxide through the lower horizontal region 1027A. Accordingly, control gate couples to the floating gate through at least two additional surface regions. Ideally, GCR approaches one in embodiments of the present invention. Practically, however, it is quite difficult for GCR to equal one. Accordingly, GCR ranges from values greater than 0.3, or greater than 0.5, or greater than 0.6, or greater than 0.8 in the embodiments of the present invention, although GCR is not limited to these values. The exact value of GCR depends upon the particular geometric configuration of the floating gate as well as the design rule of the device. Of course, the final GCR value will depend upon the particular application.

In a specific embodiment, the present memory cell can be programmed and erased by placing voltages on selected gate structures. To program the floating gate or add electrons to the floating gate, selected voltages are applied to the gate structures and source/drain regions. Electrons migrate from the source region through the channel region and inject through the tunnel oxide layer to the floating gate, where electron charge builds up. To erase the floating gate or remove electrons from the floating gate, selected voltages are applied to the gate structures and the source/drain regions. Electrons migrate from the floating gate through the tunnel oxide layer to the channel region and out through the drain region.

The embodiment described above is merely a single flash memory device with a novel gate structure. Integrated circuits include one or more of these devices in a cell. Thousands, millions, billions, and even trillions of these devices are formed in a single integrated circuit chip. Thus, the integrated circuit chip can have 4 Meg., 16 Meg. 64 Meg. 256 Meg., 1 Gig. or more devices on a single sliver of silicon. The channel length of these devices range from about 0.4 $\mu$m to 0.25 $\mu$m and less. The flash memory device can be formed in a stand alone integrated circuit chip, commonly termed the FLASH memory chip, in some embodiments. Alternatively, the flash memory device can be integrated into a microprocessor, microcomputer, digital signal processor, application specific integrated circuit, and the like. Of course, the number of cells and design size depend highly upon the application. The scope of the invention should, therefore, be determined not with reference to the above description, but instead should be determined with reference to the appended claims along with their full scope of equivalents.

What is claimed is:

1. A method of forming, on a substrate, a gate structure for an electrically programmable read-only memory cell, said method comprising the steps:

forming, on said substrate, a first oxide layer;

forming, on said first oxide layer, a first conductive layer having a surface and two spaced-apart edges extending transversely to said surface;

forming a first dielectric layer adjacent to said first conductive layer;

covering said first dielectric layer with a second dielectric layer;

etching a portion of said first and second dielectric layers positioned proximate to said surface;

forming an oxide layer adjacent to said surface by thermal oxidation; and forming a second conductive layer adjacent to said oxide layer.

2. The method as recited in claim 1 wherein said step of forming a second dielectric layer includes depositing a nitride layer.

3. The method as recited in claim 1 wherein said step of forming said first oxide region includes thermally growing a layer of silicon dioxide.

4. The method as recited in claim 1 wherein said step of forming said second oxide region includes depositing an oxide layer by thermal oxidation.

5. The method as recited in claim 1 wherein a subpart of said portion segment of said second dielectric layer is disposed adjacent to a subsection of said spaced-apart edges, forming a homogeneous spacer thereat, with the remaining subsections of said spaced-apart edges having double wall spacers formed adjacent thereto.

6. The method as recited in claim 2 wherein said step of depositing said nitride layer includes depositing a silicon nitride layer employing chemical vapor deposition techniques.

7. A method of forming, on a substrate, a gate structure for an electrically programmable read-only memory cell, said method comprising the steps:

forming, on said substrate, a first oxide region;

forming, on said region, a region of conductive material, said region of conductive material structure having a major surface and two spaced-apart minor surfaces extending transverse to said major surface;

forming, in abutting relation with said major surface and said two spaced-apart minor surfaces, a second oxide region;

covering said second oxide region with a nitride region; and forming a spacer adjacent to each of said minor surfaces which has a single wall portion and a double wall portion by removing a portion of said second oxide region and a segment of said nitride region, both of which are positioned proximate to said major surface so as to expose said first major surface, with said segment including areas of said nitride region disposed adjacent to said minor surfaces;

forming an additional oxide region adjacent to said major surface; and forming a conductive region adjacent to, but spaced apart from, said region of conductive material.

8. The method as recited in claim 7 where said single wall portion and said double-wall portion having approximately identical thicknesses.

9. The method as recited in claim 8 wherein said removing step includes anisotropically etching both said second oxide region and said nitride region.

10. The method as recited in claim 9 wherein said step of forming said second oxide region includes depositing a layer of silicon dioxide by chemical vapor deposition techniques.

11. The method as recited in claim 10 wherein said step of forming said nitride region includes depositing a silicon nitride layer employing chemical vapor deposition techniques.

* * * * *